(12) United States Patent
Ito et al.

(10) Patent No.: US 7,834,440 B2
(45) Date of Patent: Nov. 16, 2010

(54) SEMICONDUCTOR DEVICE WITH STACKED MEMORY AND PROCESSOR LSIS

(75) Inventors: Kiyoto Ito, Kokubunji (JP); Makoto Saen, Kodaira (JP); Yuki Kuroda, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/466,018

(22) Filed: May 14, 2009

(65) Prior Publication Data

US 2010/0078790 A1 Apr. 1, 2010

(30) Foreign Application Priority Data

Sep. 29, 2008 (JP) .............................. 2008-249496

(51) Int. Cl.
H01L 23/02 (2006.01)
H01L 23/34 (2006.01)
H01L 23/48 (2006.01)
H01L 23/52 (2006.01)
H01L 29/40 (2006.01)

(52) U.S. Cl. .................. 257/686; 257/685; 257/723; 257/777; 257/E25.021; 257/E25.027; 257/E27.137; 257/E27.144; 257/E27.161

(58) Field of Classification Search ......... 257/685–686, 257/723, 777, E27.161, E25.021, E25.027, 257/E27.137, E27.144
See application file for complete search history.

(56) References Cited

U.S. PATENT DOCUMENTS

| 4,939,568 | A | * | 7/1990 | Kato et al. ................... 257/686 |
| 5,481,133 | A | * | 1/1996 | Hsu ............................ 257/621 |
| 6,979,895 | B2 | * | 12/2005 | Akram et al. ................ 257/686 |
| 7,098,542 | B1 | * | 8/2006 | Hoang et al. ................ 257/778 |
| 7,102,905 | B2 | * | 9/2006 | Funaba et al. ................. 365/51 |
| 7,286,386 | B2 | * | 10/2007 | Miwa et al. .................... 365/63 |
| 7,291,929 | B2 | * | 11/2007 | Tanaka et al. ............... 257/784 |
| 7,446,420 | B1 | * | 11/2008 | Kim ........................... 257/777 |
| 2006/0267188 | A1 | * | 11/2006 | Ishino et al. ................ 257/723 |
| 2006/0267190 | A1 | * | 11/2006 | Terada et al. ................ 257/723 |
| 2007/0023887 | A1 | * | 2/2007 | Matsui ....................... 257/686 |

(Continued)

FOREIGN PATENT DOCUMENTS

JP         02032547 A   *   2/1990

(Continued)

*Primary Examiner*—Ida M Soward
(74) *Attorney, Agent, or Firm*—Miles & Stockbridge P.C.

(57) ABSTRACT

In a semiconductor device in which a plurality of memory LSIs and a plurality of processor LSIs are stacked, as the number of stacked layers increase, the communication distance of data between a memory LSI and a processor LSI will increase. Therefore, the parasitic capacitance and parasitic resistance of the wiring used for the communication increase and, as a result of which, the power and speed performance of the entire system will be degraded. At least two or more of the combinations of a processor LSI 100 and a memory LSI 200 are stacked and the processor LSI 100 and the memory LSI 200 in the same combination are stacked adjacent to each other in the vertical direction. Communication between the processor LSI 100 and the memory LSI 200 in the same combination is performed by a dedicated electrode provided therebetween, and communication between processor LSIs 100 and communication from the processor LSI 100 to the outside are performed by a through silicon via for signal 11 which passes through all the LSIs.

20 Claims, 10 Drawing Sheets

U.S. PATENT DOCUMENTS

| | | | |
|---|---|---|---|
| 2008/0122064 A1* | 5/2008 | Itoh et al. | 257/691 |
| 2008/0265430 A1* | 10/2008 | Ishihara | 257/777 |
| 2008/0277800 A1* | 11/2008 | Hwang et al. | 257/777 |
| 2009/0051046 A1* | 2/2009 | Yamazaki et al. | 257/777 |
| 2009/0172288 A1* | 7/2009 | Sukegawa | 711/128 |
| 2009/0278246 A1* | 11/2009 | Hoshino et al. | 257/686 |

FOREIGN PATENT DOCUMENTS

| | | | |
|---|---|---|---|
| JP | 06177133 A | * | 6/1994 |
| JP | 08172147 A | * | 7/1996 |
| JP | 11135716 A | * | 5/1999 |
| JP | 2002-231880 | | 8/2002 |
| JP | 2005167582 A | * | 6/2005 |

* cited by examiner

SEMICONDUCTOR DEVICE WITH STACKED MEMORY AND PROCESSOR LSIS

CLAIM OF PRIORITY

The present application claims priority from Japanese patent application JP 2008-249496 filed on Sep. 29, 2008, the content of which is hereby incorporated by reference into this application.

BACKGROUND OF THE INVENTION

1. Field of the Invention

The present invention relates to a semiconductor device in which a plurality of LSIs are stacked.

2. Background Art

So far, with the advancement of microfabrication technology, the performance improvement and functional upgrade of LSIs have been achieved by integrating more transistors in a single chip. However, due to the effects of the limits of miniaturization and the increases in the cost of utilizing state-of-the-art processes, performance improvement by means of integration into a single chip as practiced so far may not be a best solution in the future. Accordingly, three-dimensional integration by stacking a plurality of LSIs will be a promising technology. With this being the case, communication technology between LSIs to be stacked and between stacked LSIs and the outside thereof will become critical. As such a communication scheme, wired schemes based on solder bumps, through silicon via, etc. and wireless schemes are being studied.

While in the media processing and network processing in recent years, the amount of data to be transferred between a processor LSI including a CPU, etc. and a memory LSI has been increasing year by year, there is a demand for increasing the communication traffic volume therebetween and for reducing the power consumed by the communication. Under such circumstances, a method of decreasing the communication distance by stacking those LSIs has been contemplated. JP Patent Publication (Kokai) No. 2002-231880 refers to a configuration in which three LSIs, that is, a processor LSI incorporating a nonvolatile memory, a nonvolatile memory LSI, and a volatile memory LSI are stacked on top of one another, suggesting that the storage capacity in total can be increased, and further operation at a higher speed is possible.

SUMMARY OF THE INVENTION

Under the background art described above, the present inventors contemplate that in order to achieve further improvement of performance, reduction of power consumption, and increase in space efficiency, it is effective to stack a plurality of processor LSIs in conjunction with and in addition to a plurality of memory LSIs.

However, the present inventors have found a problem that increasing the number of stacked layers will result in an increase in communication distance even when the communication is in the stacking direction, and performing frequent data transmission between stacked LSIs over multiple layers will degrade the power consumption and speed performance of the entire system.

However, means for solving these problems cannot be found in JP Patent Publication (Kokai) No. 2002-231880 described above.

Typical aspects of the invention disclosed herein to solve the above described problem will be briefly described as follows.

That is, a semiconductor device, comprising: a package board; a first LSI connected to the package board including: an external I/O interface for performing communication via the package board; and a first communication section; a second LSI provided above the first LSI including: a first memory device having a plurality of first memory cells provided at intersection points of a plurality of first bit lines and a plurality of first word lines; and a second communication section; a third LSI provided above the first LSI for performing arithmetic operation including: a third communication section for communicating with the second communication section; and a fourth communication section for communicating with the first communication section; a fourth LSI provided above the second LSI and above the third LSI including: a second memory device including a plurality of second memory cells provided at intersection points of a plurality of second bit lines and a plurality of second word lines; and a fifth communication section; and a fifth LSI provided above the second LSI and above the third LSI for performing arithmetic operation including: a sixth communication section for communicating with the fifth communication section; and a seventh communication section for communicating with the first communication section.

According to the present invention, it becomes possible to reduce the power consumption and to improve the speed performance of the entire system in the stack of LSIs.

DESCRIPTION OF SYMBOLS

Figure 1:
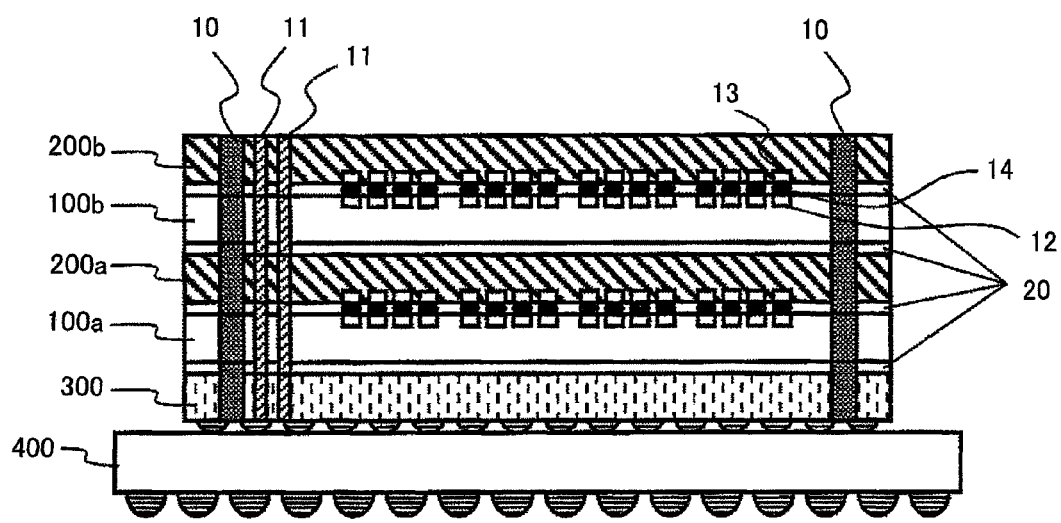
FIG. 1 is a stack sectional view to show a stacked LSI system relating to a first embodiment.

200*a*, 200*b* Memory LSI
100*a*, 100*b*, 100*c* Processor LSI
300 Interface LSI
400 Package board
10 Through silicon via for power supply
11 Through silicon via for signal 12, 13 Pad
14 Solder bump
15 Through silicon via for memory access
16 Metal pad
17 Metal inductor
18 TSV block for memory access 181, 182, 183, 184, 185, 186 Through silicon via (TSV)
20 Underfill resin
21 Bonding wire for power supply
22 Bonding wire for signal
23 Pad
101 PU Processing unit
102 PERI Peripheral block
103 DMAC Direct memory access controller
104 3DMC 3D stacked memory access controller
1041 ARB Memory access arbiter
105 3DCOMIF 3D intra-chip communication interface
106 OCIC On-chip interconnect
107 OCBR On-chip interconnect bridge
108 Pad block for memory access
109 TSV block for 3D intra-chip communication
201 MEM Memory block
202 3DMEMIF 3D stacked memory interface
203 Pad block for memory access
204 TSV block for 3D intra-chip communication
205 3D intra-chip communication interface
206 OCIC On-chip interconnect
301 2DIOP High-speed I/O interface
302 2DIOC High-speed I/O interface controller
303 SCTRL Micro controller for high-speed I/O
304 COMPERI Peripheral block of interface LSI
305 3DCOMIF-2 3D intra-chip communication interface
306 3DCOMARB 3D intra-chip communication arbiter
307 TSV block for 3D intra-chip communication
308 OCIC On-chip interconnect
309 OCBR On-chip interconnect bridge
310 DMA Direct memory access block

DETAILED DESCRIPTION OF THE PREFERRED EMBODIMENTS

Hereinafter, concrete embodiments of the semiconductor device relating to the present invention will be described in detail based on the drawings.

EXAMPLE 1

(Configuration)
FIG. 1 is a stack sectional view to show the semiconductor device relating to a first embodiment according to the present invention. In the present embodiment, a memory LSI 200 mounted with a memory for storing data and a processor LSI 100 mounted with an arithmetic unit are stacked in such a way that respective surfaces on which circuitry is disposed face each other. A pad 12 on the processor LSI 100 and a pad 13 on the memory LSI 200 are electrically connected with a solder bump 14. Two sets of combinations of such processor LSI 100 and memory LSI 200, that is, a combination of a processor LSI 100a and a memory LSI 200a and a combination of a processor LSI 100b and a memory LSI 200b are stacked. An interface LSI 300 is stacked in the underlying layer, and the entire structure is stacked on a package board 400. Further, the present embodiment includes a through silicon via for power supply 10 for providing power supply to each LSI and a through silicon via for signal 11 for electrically connecting each processor LSI 100a, 100b with the interface LSI 300. It is noted that the through silicon via for signal 11 realizes only the connection between upper and lower surfaces in the memory LSI 200a, 200b, and does not electrically connect with the circuits in the memory LSI 200a, 200b. In this respect, a through silicon via is an electrical connection between stacked LSIs fabricated by opening a hole vertically through the substrate silicon and filling the hole with a conductive material. Moreover, an underfill resin 20 is inserted between layers of each LSI to be stacked.

The processor LSI 100 refers to general purpose processors such as a CPU, special purpose processors such as a graphics accelerator, reconfigurable processor in which a large number of arithmetic circuits such as adders and multipliers are placed and are connected with each other by switch circuits, and LSIs mounted with a field-programmable gate array (FPGA), etc.

The memory LSI 200 refers to an LSI mounted with a memory device including a memory cell such as a DRAM or SRAM, a flash memory and a magnetic storages.

The interface LSI 300 includes a circuit for performing a high-speed wired communication with components on the substrate of a system other than the concerned stacked LSI system and, via the interface LSI, communication with the outside of the stacked LSI is performed. The interface LSI is flip-connected with its circuitry/wiring surface facing toward the package board side.

As so far described above in detail, the invention relating to Example 1 is configured such that an interface LSI is stacked above the substrate, and a combination of a processor LSI and a memory LSI is further stacked thereabove. In each combination, the processor LSI and the memory LSI respectively include a communication section for communicating with each other. Further, the interface LSI and the processor LSI respectively include a communication section for communicating with each other. The characteristic feature that LSIs are stacked in such order as described above and two types of communication paths, that is, a communication path through the communication sections between the processor LSI and memory LSI which are combined together (hereafter abbreviated as an "inter-combination-LSI communication path") and a communication path by the communication sections between the interface LSI and each processor LSI (hereafter abbreviated as a "global communication path") are provided will bring about advantages described below. The details of the communication sections of each LSI will be described below. Moreover, although FIG. 1 shows an arrangement in which a memory LSI is stacked above a processor LSI, there is no limitation on the relative position of the processor LSI and the memory LSI relationship in the vertical direction provided that a plurality of combinations consisting of a processor LSI and a memory LSI are stacked.

The above described configuration in which an inter-combination-LSI communication path is provided in addition to a global communication path enables that all of the communication sections for the inter-combination-LSI communication path can be used between a processor LSI and a memory LSI which are combined together. On that account, it becomes possible to improve the throughput of the communication between combinations.

Further the processor LSI and memory LSI which are combined together are configured such that respective surfaces on which circuitry is disposed face toward the combined counterpart LSI. In the example of FIG. 1, the processor LSI 100a (100b) is configured such that its surface on which circuitry is disposed faces toward the memory LSI 200a (200b). In the example 1 of FIG. 1, since the processor LSI is disposed below the memory LSI in each combination, the surface on which circuitry is disposed of the processor LSI faces upwardly (face-up). Since the memory LSI is disposed in an opposite manner such that it faces toward the processor LSI, the surface on which circuitry is disposed faces downwardly (face-down).

Such configuration of LSIs will result in an arrangement that the surfaces on which circuitry is disposed face each other between combined LSIs, thus enabling to minimize the length of the communication path. That is, the wiring length of the communication path decreases thereby suppressing the parasitic capacitance and parasitic resistance at a low level. Thus, it becomes possible to suppress the power and delay in the data communication between the processor LSI and the memory LSI, which is mostly performed during arithmetic operation, thereby reducing the energy consumption and improving the speed performance of the entire system. The details of the communication scheme will be described below. It is noted that upward or downward orientation of the surface is not limited to the above described example, and when the relative position of the processor LSI and the memory LSI is reversed, the orientation of each surface will be, without saying, reversed.

These advantages are especially effective when executing an application data to be processed can be divided into any number of processing units, and the data of each processing unit are not dependent on each other and can be stored on a memory device on a single memory LSI. Examples of such application include image processing, packet processing in a network infrastructure, and others.

(Communication)

Next, communication paths between the LSIs and to and from the outside of the package in the present embodiment will be described.

The term "communication" as used herein will not be limited to communication in a narrow sense, but will refer to the input and output of all kinds of information, including initial value signals such as reset signals and terminal settings, and identification signals of LSIs, but excepting that of the power supply.

Communication between the processor LSI 100*a* and the processor LSI 100*b* and communication between the processor LSI 100*a* or the processor LSI 100*b* and the interface LSI 300 are performed by a through silicon via for signal 11. Communication between the processor LSI 100 and memory LSI 200 which are combined together, for example between the processor LSI 100*b* and the memory LSI 200*b* in FIG. 1 is via a pad 12, a solder bump 14, and a pad 13. On the other hand, communication between a certain LSI 100 and a memory LSI 200 which is in a different combination, for example, communication from the processor LSI 100*a* to the memory LSI 200*b* in the FIG. 1 is by the through silicon via for signal 11, the circuitry and wiring in the processor LSI 100*b*, the pad 12, the solder bump 14, and the pad 13. Further, communication from the memory LSI 200*b* to the processor LSI 100*a* is via the opposite path. Communication between the processor LSI 100 and the outside of the package is by the through silicon via for signal 11, the circuitry and wiring in the interface LSI 300, and the wiring in the package board 400.

Communication between an interface LSI 300 and a memory LSI 200, for example, communication between the interface LSI 300 and the memory LSI 200*b* is by the through silicon via for signal 11, the circuitry and wiring in the processor LSI 100*b*, the pad 12, the solder bump 14, and the pad 13. Communication between the interface LSI 300 and the outside of the package is via the wiring in the package board 400. Communication between a memory LSI 200 and the outside of the package, for example, communication between the memory LSI 200*b* and the outside of the package is via the pad 13, the solder bump 14, the pad 12, the circuitry and wiring in the processor LSI 100*b*, the through silicon via for signal 11, the circuitry and wiring in the interface LSI 300, and the wiring in the package board 400.

Thus, the invention illustrated in FIG. 1 is characterized in that at least two or more sets of combinations of processor LSIs 100 and memory LSIs 200 are stacked in a semiconductor package, and the processor LSI 100 and the memory LSI 200 in the same combination are stacked adjacent to each other in the vertical direction, and that communication between the processor LSI 100 and the memory LSI 200 in the same combination is performed via a dedicated solder bump provided therebetween; communication between processor LSIs and communication between a processor LSI 100 and the interface LSI 300 are performed by the through silicon via for signal 11 which passes through all the LSIs.

Therefore, when a processor LSI 100 performs the reading or writing of the stored information on the memory LSI 200 which is in combination therewith, it is possible to limit the portion to be electrically activated to the solder bump 14 between the LSIs, and therefore there is no need of driving the through silicon via for signal 11. Thus, operation at lower power and at a higher speed becomes possible compared with the case of accessing an interface LSI 300 or a processor LSI 100 in a different combination.

Further, since communication can be performed concurrently between the processor LSI 100 and the memory LSI 200 in each combination, it is possible to increase the amount of communication of the entire package compared with the case in which only the through silicon via for signal 11 is provided.

By performing connection with a solder bump within each combination, it is made possible to minimize the wiring length thereby enabling to implement wiring with a low resistance and a low parasitic capacitance in a combination in which frequent access is made.

A through silicon via for power supply 10 is a through silicon via for providing a common power supply to stacked LSIs. The power supply is connected from the outside of the package to the power supply line on each LSI to be stacked via the package board, the interface LSI 300, and the through silicon via for power supply 10. Thus, by providing a through silicon via for power supply for providing power supply to all LSIs, it is possible to implement a power supply to each LSI by a simple configuration.

It is noted that although FIG. 1 shows a case in which a common power supply is used in all the LSIs, the present invention will not be limited to such a case. Although not shown in FIG. 1, it is also possible to provide a through silicon via which passes through only certain LSIs to provide power supply only to a particular LSI. For example, when a high power supply is needed only for processor LSIs 100, or a high power supply is needed only for memory LSIs, a through silicon via for power supply may be separately provided which passes through other LSIs and connects only with the power supply line in the processor LSI 100. Alternatively, configuration may be such that a through silicon via for providing power supply between a processor LSI and a memory LSI to be combined may be provided in each combination.

By such a configuration of separately providing a path for providing power supply to a particular LSI, it is made possible to selectively provide a high power supply to a particular LSI. Further, by separately providing a power supply path for an LSI in which arithmetic load is especially high, it is made possible to enable more stable arithmetic operation. Further by controlling power supply to be temporally stopped for an LSI which does not perform arithmetic operation, it is possible to realize energy saving.

(Operation)

As the typical operation of the system, description will be made on a case of executing an application in which data to be processed can be divided into any number of processing units. First, the interface LSI 300 accepts data into a memory LSI 200 such that each processing unit is distributed in a different memory LSI 200. For such data, each processor LSI 100 performs arithmetic operation, etc. If data which constitute processing units are not mutually dependent, each processor LSI 100 will mainly access only the memory LSI 200 in combination. When the processing is completed, the interface LSI 300 reads the processing result from the memory LSI 200 and outputs the result to the outside of the package.

(Configuration of Each Chip)

Figure 2:
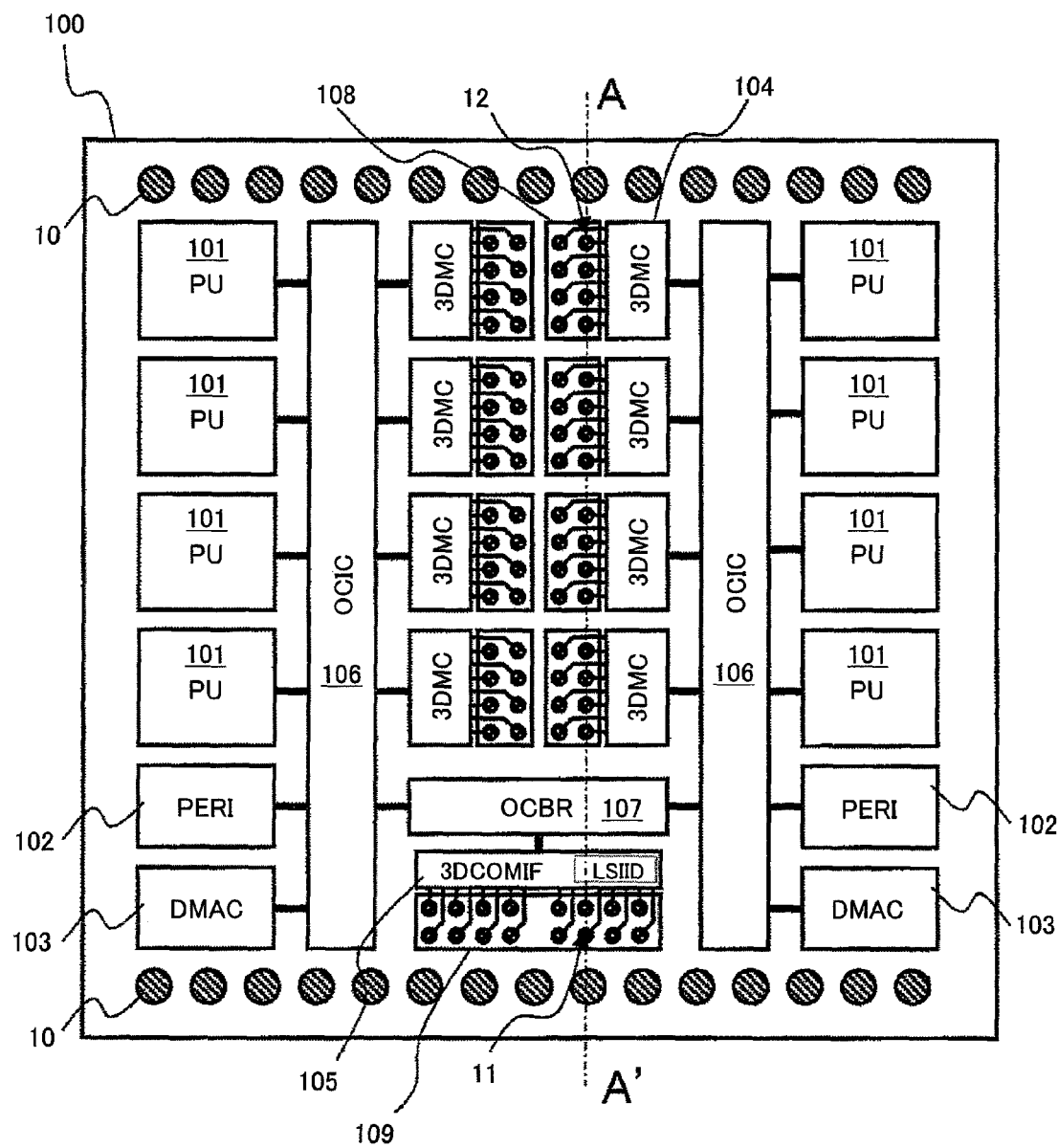
FIG. 2 is a plan view to show an embodiment of the processor LSI 100 relating to the first embodiment.

FIG. 2 is a plan view to show an embodiment of the processor LSI 100, in which the line corresponding to the stack-layer section in FIG. 1 is shown by A-A'. In FIG. 2, the processor LSI 100 includes a processing unit 101 for performing arithmetic operation; a Peripheral block 102 including interrupt control, clock control, and timer circuits; a direct memory access controller 103; a 3D stacked memory access controller 104 for controlling the memory access to combined memory LSI 200; a 3D intra-chip communication interface 105 for communicating with another processor LSI or an interface LSI 300 to be stacked; an on-chip interconnect 106 for connecting between the blocks in the processor LSI 100; an on-chip interconnect bridge 107 for performing the connection between on-chip interconnects 106 and the connection with the 3D intra-chip communication interface 105; pad block for memory access 108 for the communication with the memory LSI 200; and TSV block for 3D intra-chip communication 109 for performing the communication with another processor LSI or interface LSI to be stacked. Further, there are provided a plurality of through silicon vias for power supply 10 shown in FIG. 1 along the outer periphery of the processor LSI 100.

In the correspondence between the above described global communication path and the inter-combination-LSI communication path, the 3D stacked memory access controller 104 serves as a communication section corresponding to the inter-combination-LSI communication path, and performs the communication with the 3D stacked memory interface 202, which is the communication section of the memory LSI described below in FIG. 3. Further, the 3D intra-chip communication interface 105 serves as the communication section corresponding to the global communication path, and performs the communication with the 3D intra-chip communication interface 105 of another processor LSI or a 3D intra-chip communication interface 305 which is the communication section of an interface LSI.

In FIG. 2, although description has been made on example in which the through silicon via for signal 11 is used as the global communication path and the solder bump 14 is used as the inter-combination-LSI communication path, the configuration of the communication section may be the same in other communication schemes (wireless communication, wire bonding, and others to be described below). The above description goes for the memory LSI in FIG. 3 and the interface LSI in FIG. 4 as well.

A plurality of pads 12 shown in FIG. 1 are provided within the pad block for memory access 108 and used for the communication with the memory LSI 200 connected via the solder bump 14. When a read/write request from/into the storage region in the combined memory LSI 200 takes place from the processing unit 101 within the processor LSI 100 and the direct memory access controller 103; the request reaches a 3D stacked memory access controller 104 via an on-chip interconnect 106 or an on-chip interconnect bridge 107 and, based on the request, the 3D stacked memory access controller 104 outputs a data read/write request to the combined memory LSI 200 via the pad block for memory access 108. Then, the reply data to the request from the memory LSI is received by the 3D stacked memory access controller 104 via the pad block for memory access 108, and the 3D stacked memory access controller 104 outputs the information to the processing unit 101 or direct memory access controller 103, which have made the request, via the on-chip interconnect 106 or on-chip interconnect bridge 107.

A plurality of through silicon vias for signal 11 shown in FIG. 1 are provided within the TSV block for 3D intra-chip communication 109, and are used to perform the communication with another processor LSI 100 and an interface LSI 300, which are to be stacked. When a data transfer request takes place to another processor LSI 100, an interface LSI 300, or a memory LSI 200 combined with another processor LSI 100 from the processing unit 101 or the direct memory access controller 103, etc. in the processor LSI 100, the request reaches the 3D intra-chip communication interface 105 via the on-chip interconnect 106 and the on-chip interconnect bridge 107, and the 3D intra-chip communication interface 105 outputs the information to the TSV block for 3D intra-chip communication 109. When there is a reply to the request from another processor LSI 100, an interface LSI 300, or a memory LSI 200 combined with another processor LSI 100, the 3D intra-chip communication interface 105 outputs that information to the processing unit 101 and the direct memory access controller 103, which have made the request, via the on-chip interconnect bridge 107 and the on-chip interconnect 106.

On the other hand, when a read/write request to the storage region of the memory LSI 200 combined with this processor LSI 100 takes place from another processor LSI 100 or an interface LSI 300, the 3D intra-chip communication interface 105 receives the request via the TSV block for 3D intra-chip communication 109, and transmits the request to the 3D stacked memory access controller 104 via the on-chip interconnect bridge 107 and the on-chip interconnect 106. Based on the request, the 3D stacked memory access controller 104 outputs a data read/write request to the combined memory LSI 200 via the pad block for memory access 108. Then, a reply data from the memory LSI to the request is received by the 3D stacked memory access controller 104 via the pad block for memory access 108, and the 3D stacked memory access controller 104 transmits that information to the 3D intra-chip communication interface 105 via the on-chip interconnect 106 and the on-chip interconnect bridge 107, and the 3D intra-chip communication interface outputs that information to another processor LSI 100 or an interface LSI 300 which has made the request, via the TSV block for 3D intra-chip communication 109.

Thus, in the present embodiment, all of the data read/write requests to the storage region of the memory LSI 200 combined with the present processor LSI 100 can be arbitrated by the on-chip interconnect 106 or the on-chip interconnect bridge 107 in the present processor LSI 100. That is, it is characteristic that conventional access arbitration blocks which have been used in the same chip can be utilized as they are, and there is no need of providing a memory access arbitration block dedicated for between stacked chips.

It is noted that exactly the same layout can be used for the processor LSI 100*a* and the processor LSI 100*b* in FIG. 1. In this case, in FIG. 2, an identifier for distinguishing LSIs, LSIID, is stored in the 3D intra-chip communication interface 105. Upon transmitting/receiving data to/from another processor LSI 100, the aforementioned LSIID is included in the request information by such as embedding it in a part of the address as the information to identify the LSIs of the source and the destination. Examples of the method of providing the identifier LSIID include a method of integrating a non-volatile memory device in an LSI, and writing the value or LSIID into the volatile memory device upon stack assembly.

Figure 3:
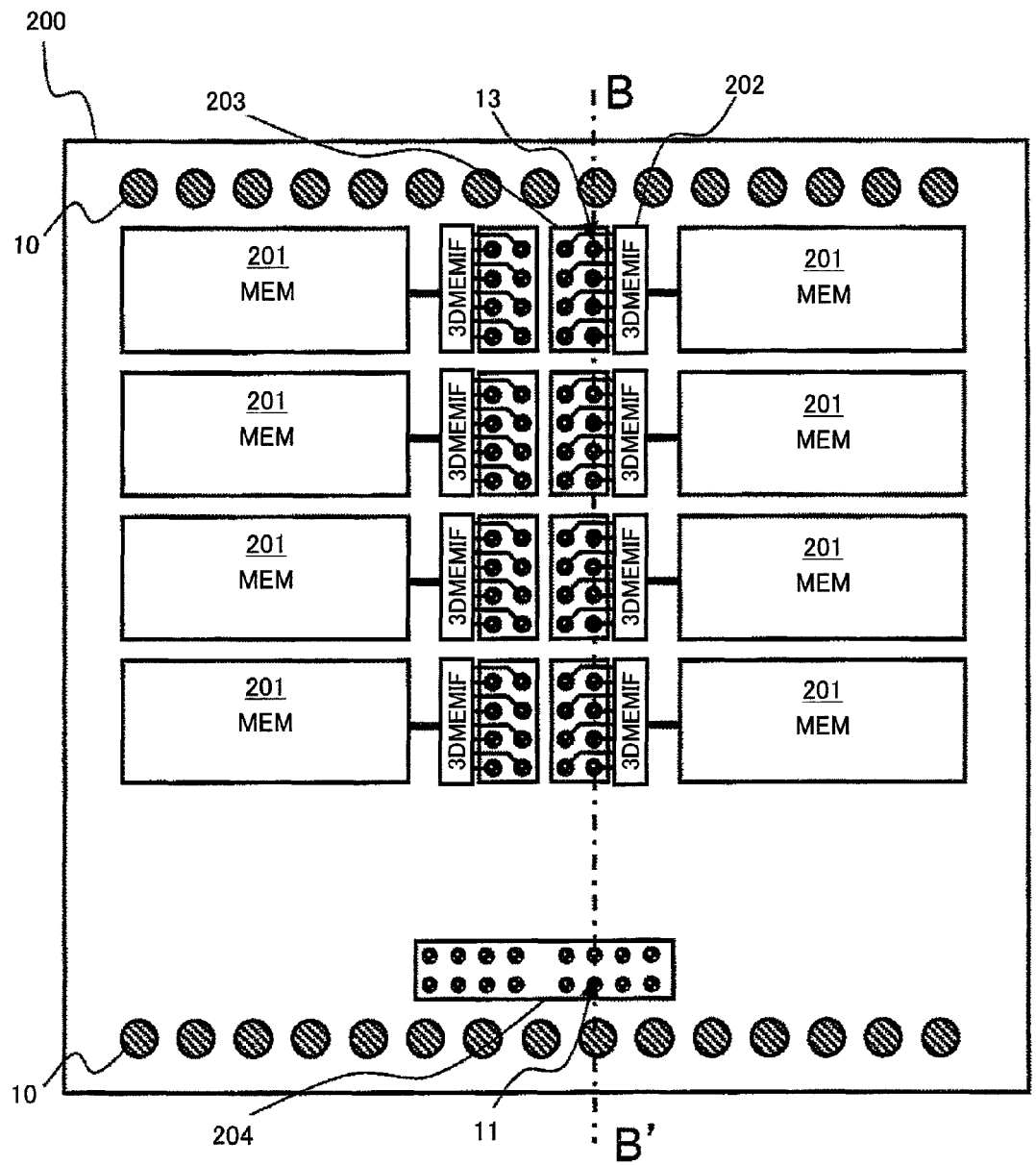
FIG. 3 is a plan view to show an embodiment of the memory LSI 200 relating to the first embodiment.

FIG. 3 is a plan view to show an embodiment of the memory LSI 200, in which the line corresponding to the stack section in FIG. 1 is shown by B-B'. In FIG. 3, the memory LSI 200 includes: a memory block 201 including a memory array; a 3D stacked memory interface 202 for controlling the memory access communication from the combined processor LSI; pad block for memory access 203 for memory access communication from the combined processor LSI 100; and TSV block for 3D intra-chip communication 204. Further, a plurality of through silicon vias for power supply 10 shown in FIG. 1 are provided along the outer periphery of the memory LSI 200.

A plurality of pads 13 shown in FIG. 1 are provided within the pad block for memory access 203 and are used for the communication with the combined processor LSI 100. The 3D stacked memory interface 202 receives a read/write request to the storage region from the combined processor LSI 100 via the pad block for memory access 203, and according to that request, performs the reading/writing from and into the memory block 201 to be connected and outputs reply information including the data read out, when it is a read request, to the processor LSI 100 via the memory-access pads.

A plurality of through silicon vias for signal 11 shown in FIG. 1 are provided within the TSV block for 3D intra-chip communication 204. It is noted that a through silicon via 11 herein only passes through the LSI substrate and does not have electrical connection with the circuitry disposed on the memory LSI 200.

In the correspondence between the above described global communication path and the inter-combination-LSI communication path, the 3D stacked memory interface 202 serves as a communication section corresponding to the inter-combination-LSI communication path, and performs the communication with the 3D stacked memory access controller in the above described processor LSI. The communication section corresponding to the global communication path is not provided in the present example, and communication via the processor LSI is performed concerning the global communication.

Figure 4:
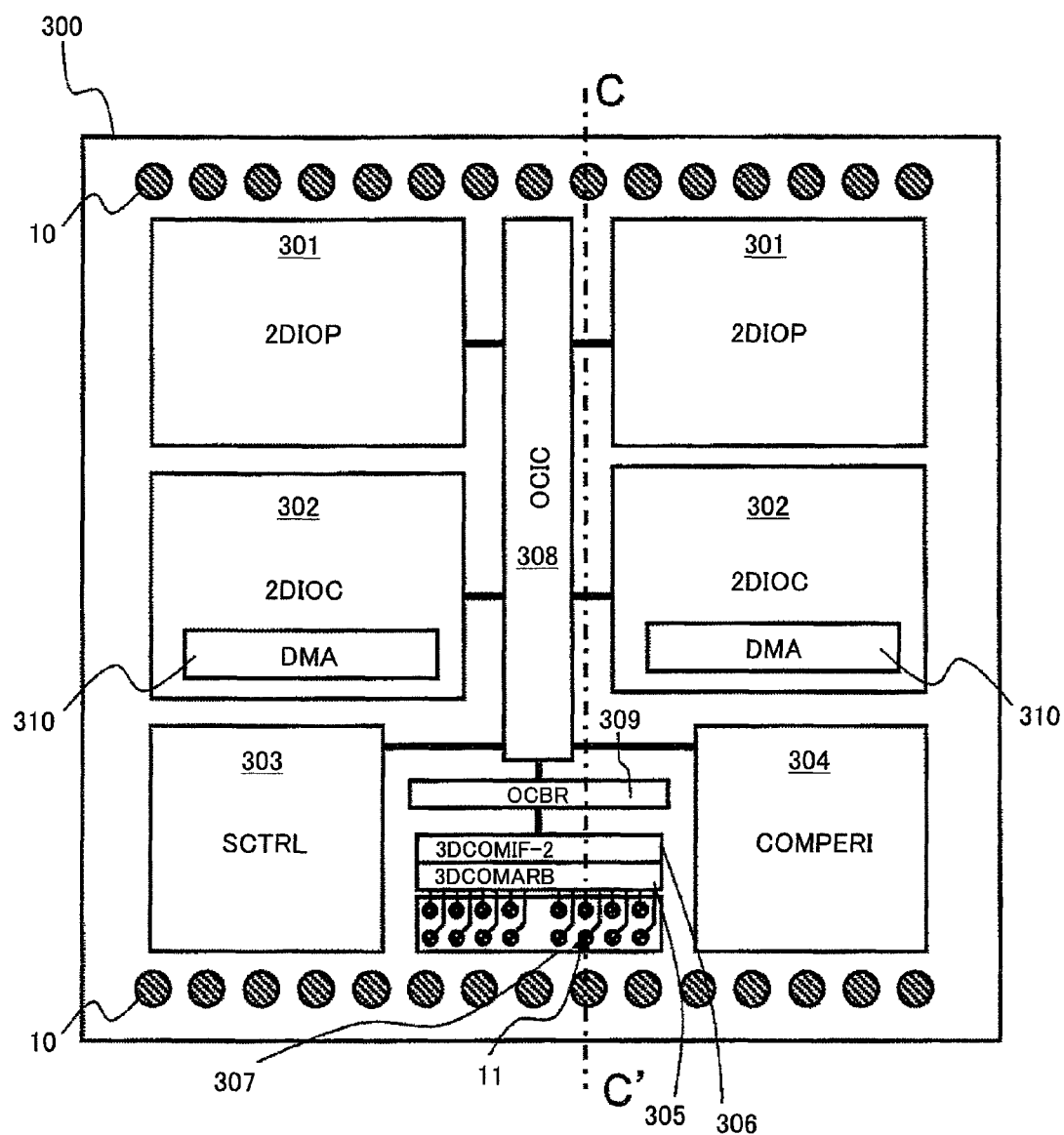
FIG. 4 is a plan view to show an embodiment of the interface LSI 300 relating to the first embodiment.

FIG. 4 is a plan view to show an embodiment of the interface LSI 300, in which the line corresponding to the stack section in FIG. 1 is shown by C-C'. In FIG. 4, the interface LSI 300 includes: a high-speed I/O interface 301 for performing a high speed communication with components outside the stacked package; a high-speed I/O interface controller 302 for controlling the high-speed I/O interface 301; a micro controller for high-speed I/O 303 for controlling the high-speed I/O interface controller 302; a peripheral block of interface LSI 304 including a clock control section and a power control section of the entire package; a 3D intra-chip communication interface 305 for performing the communication with another processor LSI 100 to be stacked; a 3D intra-chip communication arbiter 306 for arbitrating the communication between processor LSIs 100 and between the processor LSI 100 and the interface LSI 300; TSV block for 3D intra-chip communication 307 for performing the communication with another processor LSI to be stacked; an on-chip interconnect 308 for connecting between on-chip blocks; and an on-chip interconnect bridge 309 for bridging the communication between the on-chip interconnect 308 and another LSI to be stacked. Further, a plurality of through silicon vias for power supply 10 shown in FIG. 1 are provided along the outer periphery of the interface LSI 300.

The high-speed I/O interface controller 302 includes a Direct memory access block 310 for performing data transfer between address areas designated in a built-in register.

Further, the micro controller for high-speed I/O 303 executes the processing relating to the communication with other stacked LSIs and the outside of the package such as a program to perform the communication with a processor LSI and a program for setting a register of the high-speed I/O interface controller 302.

A plurality of the through silicon vias for signal 11 shown in FIG. 1 are provided within the TSV block for 3D intra-chip communication 307 and are used to perform the communication with another LSI to be stacked. In this configuration, the through silicon via for signal 11 is a communication path shared by all the processor LSIs 100 and interface LSIs 300 to be stacked as describe above. Thus, at some time point, it is necessary to arbitrate which LSI is used for communication, and a 3D intra-chip communication arbiter 306 for that arbitration is provided in the interface LSI 300.

In the present embodiment, when the processor LSI 100 performs communication using the through silicon via for signal 11, the processor LSI 100, prior to communication, notifies a use request of the global communication path to the 3D intra-chip communication arbiter 306 in the interface LSI 300 by a through silicon via for arbitration signal provided uniquely in each chip, and the 3D intra-chip communication arbiter 306, in response to the use request, performs arbitration by appropriately distributing the right of using global communication path to each processor LSI 100 by the through silicon via for arbitration signal. It is noted that the aforementioned through silicon via for arbitration signal is included in the through silicon via for signal 11 in the TSV block for 3D intra-chip communication 109 and 307.

On the other hand, when a data read/write request to a processor LSI 100 or a memory LSI 200 by the high-speed I/O interface controller 302 in the interface LSI 300, etc. takes place, the request reaches the 3D intra-chip communication interface 305 via the on-chip interconnect 308 and the on-chip interconnect bridge 309. The 3D intra-chip communication interface 305 notifies the use request for the global communication path for using the through silicon via for signal 11 to the 3D intra-chip communication arbiter 306. Upon being notified of permission of the use from the 3D intra-chip communication arbiter 306, the 3D intra-chip communication interface 305 outputs the request to the target processor LSI 100 via the TSV block for 3D intra-chip communication 109. Then, it receives reply data from the target processor LSI 100 and outputs the replay data to the high-speed I/O interface controller 302 and others, which have made the request, via the on-chip interconnect bridge 309 and the on-chip interconnect 308. Thus, providing the 3D intra-chip communication arbiter 306 in the interface LSI with an arbitration function will obviate the need of providing an arbitration function in the processor LSI, and thereby enables to reduce the area of the processor LSI. This effect will be particularly advantageous in terms of area when stacking a plurality of processor LSIs.

In the correspondence of the above described global communication path and inter-combination-LSI communication path, the 3D intra-chip communication interface 305 and the 3D intra-chip communication arbiter 306 are equivalent to the communication section corresponding to the global communication path. Since the interface LSI is not included in a combination LSI, as a matter of course, it has no communication section which is equivalent to the inter-combination-LSI communication path.

(Timing Chart)

Figure 5:
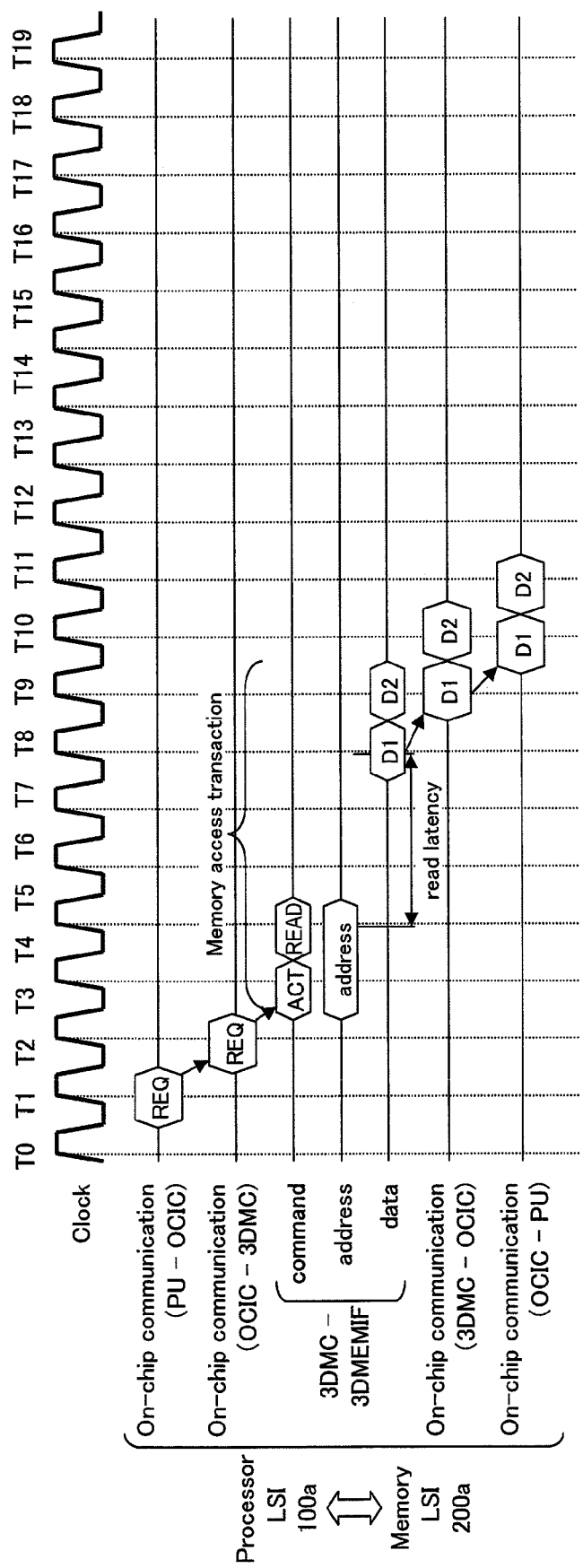
FIG. 5 shows the operational sequences when a processing unit 101 of the processor LSI 100*a* in FIG. 1 reads out data stored in a memory block 201 in the memory LSI 200*a* in FIG. 1.

FIG. 5 shows the operational sequence in which the processing unit 101 in the processor LSI 100a shown in FIG. 2 reads data stored in the memory block 201 in the memory LSI 200a which is combined with processor LSI 100a in FIG. 1. First, the processing unit 101 sends out a request REQ which includes an instruction to read out data and an address to show the storage region of the data, to the on-chip interconnect 106. Based on the address information included in the request REQ, the on-chip interconnect 106 transfers the request REQ to the 3D stacked memory access controller 104 which controls the corresponding storage region. It is noted that when the corresponding 3D stacked memory access controller 104 is connected to another on-chip interconnect 106 at this moment, the request is transferred to the specified on-chip interconnect 106 via the on-chip interconnect bridge 107. The 3D stacked memory access controller 104, in response to the received request REQ, outputs a series of memory access commands and addresses to the 3D stacked memory interface 202 of the combined memory LSI 200a via the pad block for memory access 108. In FIG. 5, it is shown that an ACT command which activates the memory block 201 and a READ command which subsequently performs read-out of data are sent out. The 3D stacked memory interface 202 controls the memory block 201 based on the command and the address. Then, after undergoing a latency (3 cycles) specified by the memory block 201, data is read out through the 3D stacked memory interface 202 and transmitted to the 3D stacked memory access controller 104 via the pad blocks for memory access 108. The 3D stacked memory access controller 104 sends out the received information to the on-chip interconnect 106, and the on-chip interconnect 106 transfers it to the processing unit 101 which has sent out the request REQ.

Figure 6:
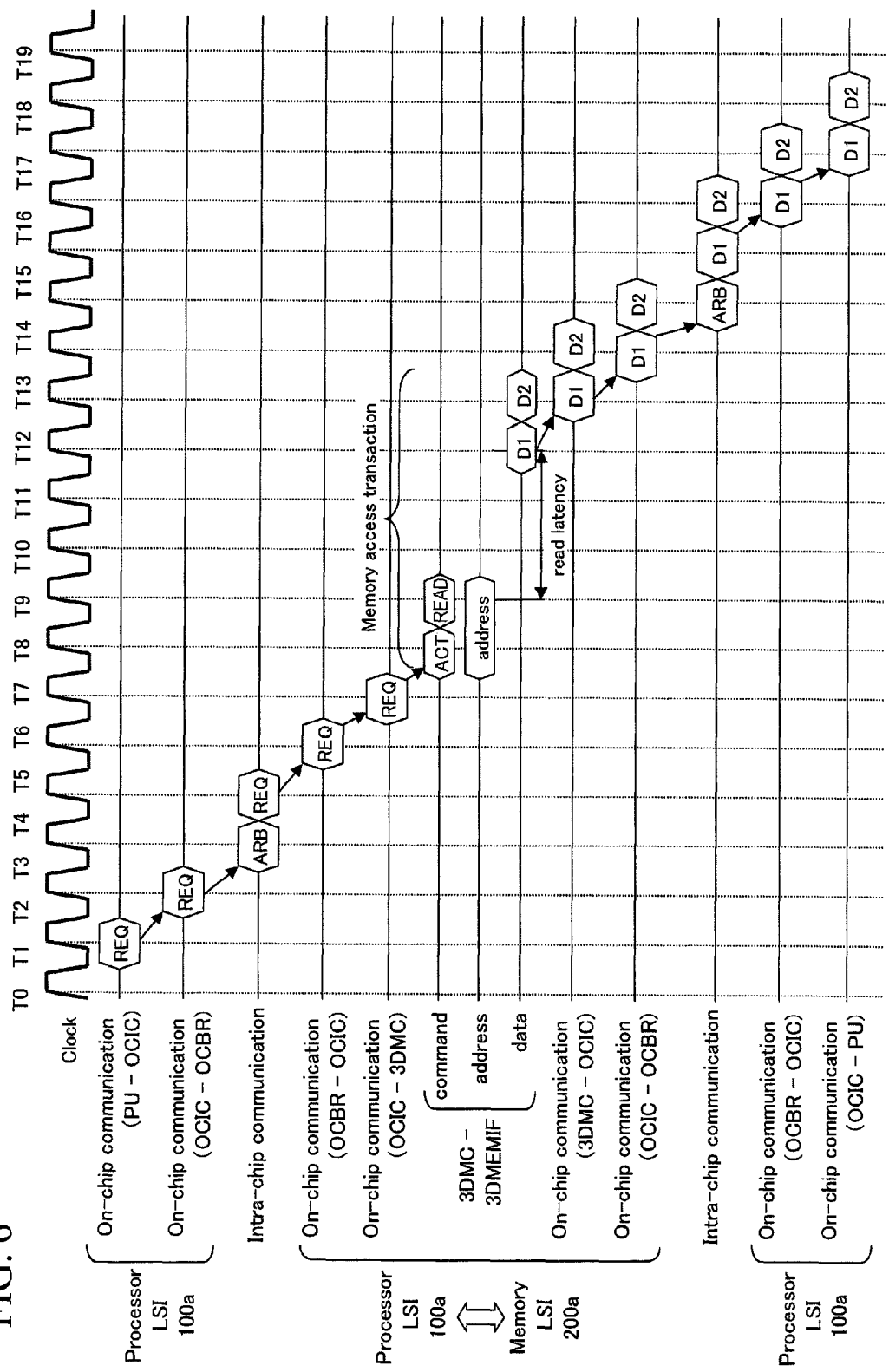
FIG. 6 shows the operational sequences when a processing unit 101 of the processor LSI 100*a* in FIG. 1 reads out data stored in a memory block 201 in the memory LSI 200*b* in FIG. 1.

FIG. 6 shows the operation when the processing unit 101 in the processor LSI 100a shown in FIG. 1 reads out data stored in the memory block 201 in the memory LSI 200b which is not combined with processor LSI 100a in FIG. 1. First, the processing unit 101 in the processor LSI 100a sends out a request REQ which includes an instruction to read out data and an address to show the storage region of the data, to the on-chip interconnect 106 in the processor LSI 100a. When it is determined that the corresponding storage region is on a memory combined with another processor LSI based on the address information included in the request REQ, the on-chip interconnect 106 transfers the request REQ to the on-chip interconnect bridge 107 in the processor LSI 100a. The on-chip interconnect bridge 107 in the processor LSI 100a sends out an inter-LSI communication arbitration request ARB to the 3D intra-chip communication arbiter 306 on the interface LSI 300 via the TSV block for 3D intra-chip communication 109. Then, upon receiving permission of the use from the 3D intra-chip communication arbiter 306, the on-chip interconnect bridge 107 in the processor LSI 100a transfers the request REQ to the on-chip interconnect bridge 107 on the processor LSI 100b via the TSV block for 3D intra-chip communication 109. The on-chip interconnect bridge 107 in the processor LSI 100b reads out data from the memory block 201 on the memory LSI 200b combined with the processor LSI 100b in the same procedure as in the operation sequence shown in FIG. 5, and returns the received data to the on-chip interconnect bridge 107 in the processor LSI 100a in a reversed flow to that in the procedure by which the request REQ has been received.

Comparing FIG. 5 with FIG. 6, the time required for a request REQ to reach a target memory is 3 clocks from T0 to T3 between combined LSIs, and 7 clocks from T0 to T7 between LSIs which are not combined. Similarly, the latency after the read-out of memory is completed is 4 clocks from T6 to T10 between combined LSIs and 9 clocks from T10 to T19 between LSIs which are not combined.

The reason why a high-speed communication can be performed between combined LSIs is that inter-chip communication, which is necessary between LSIs which are not combined, is obviated and only one time of on-chip communication, which is performed between LSIs in each combination, is sufficient.

From the above described reason, it is possible to perform the communication between a processor LSI and a memory LSI combined therewith at a high speed.

This characteristic feature is especially suitable when executing an application such as image processing and network infrastructure, in which data to be processed can be divided into any number of processing units, and the data of processing unit are not dependent on each other and can be stored in a single memory LSI.

It is noted that although the processor LSIs 100a and 100b operate at the same clock frequency and phase, that is not necessarily the case. When the processor LSIs 100a and 100b operate at different frequencies, communication can be enabled by providing a circuit for absorbing the differences in clock frequency and phase in, for example, a 3D intra-chip communication interface 105 in the processor LSI 100 and a 3D intra-chip communication interface 305 in the interface LSI 300.

(Variant)

(Interface LSI)

Although, in the first embodiment described above, a dedicated interface LSI 300 for performing the communication with the outside of package is provided, the present invention is not limited to such configuration. For example, there is a method in which an interface and a control circuit block for communicating with the outside of package are provided in each processor LSI 100 and a lowermost processor LSI 100 of the stacked processor LSIs 100 is connected with a package board 400. This method is disadvantageous in that a separate circuit for external communication needs to be provided in the processor LSI 100 and thus the circuit area needed for computation will be reduced, but is advantageous in that the kinds of LSIs to be stacked can be decreased thereby reducing the cost in volume production of the entire package.

(Stack Configuration of Memory)

Although, in the above described first embodiment, description has been made that a memory LSI 200 and a processor LSI 100 are stacked in such a way that respective surfaces on which circuitry is disposed face each other, the present invention will not be limited to this configuration and can be changed as follows.

Figure 7:
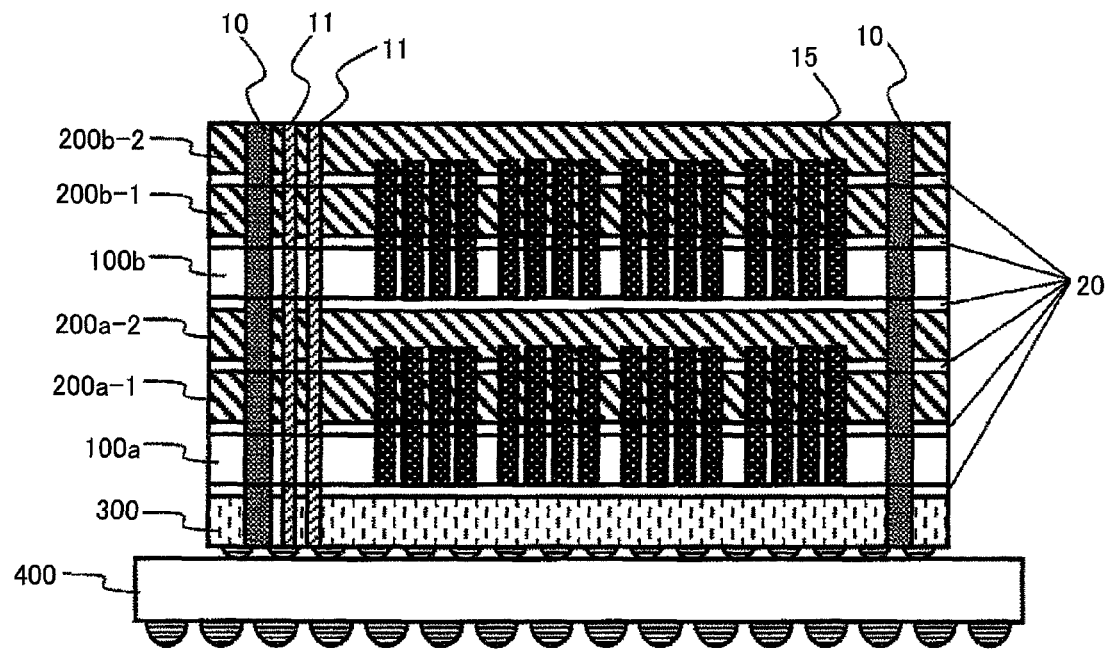
FIG. 7 is a stack sectional view to show a stacked LSI system in which two memory LSIs 200 are stacked in each combination, as a variant of the first embodiment.

For example, in the example shown in FIG. 7, a memory LSI 200a-1 and a memory LSI 200a-2 are stacked on the overlying layer of a processor LSI 100a and are electrically connected with a through silicon via for memory access 15 to form a combination. Similarly, a processor LSI 100*b* forms a combination with a memory LSI 200*b*-1 and a memory LSI 200*b*-2. The through silicon via for memory access 15 replaces the pads 12 and 13, and the solder bump 14 in FIG. 1 and the configurations of other LSIs are the same as those of the above described first embodiment. It is noted that although, in FIG. 5, all the LSIs are disposed with their surfaces on which circuitry is disposed facing downwardly (face-down), they may be disposed with their surfaces on which circuitry is disposed facing upwardly (face-up).

Since two memory LSIs 200 are stacked in the same combination in FIG. 7, at the time of a read/write request from the processor LSI 100, the target memory LSI 200 needs to be identified. For this purpose, a part of the address information included in a read/write request output from a 3D stacked memory access controller 104 in the processor LSI 100 is utilized as an LSI identifier. The memory LSI 200 includes an LSI identifier which is prerecorded by a method such as burning off a fuse on the LSI during package assembly as with the first embodiment. The 3D stacked memory interface 202 in the memory LSI 200 responses only when the received read/write request includes the same information as the LSI identifier of the own LSI. Thus, the present embodiment enables to stack a plurality of memory LSIs 200 without significantly altering the circuit configuration.

The embodiment in FIG. 7 is disadvantageous in that the wiring length of the through silicon via will increase even within the same combination in the access from the processor LSI 100 to the memory LSI 200 and, as the result of which, driving load will increase thus sacrificing power and speed performances; but is advantageous in that the memory capacity within the same combination can be easily increased.

(Use of Wireless Communication, Bonding Wire)

Although, in the above described first embodiment, the processor LSI 100 and memory LSI 200 which are combined together are connected by a pad 13 and a solder bump, the configuration is not limited to this one, but may be any one provided that the processor LSI 100 and the memory LSI 200 can communicate. Similarly, although the communication between processor LSIs 100 and the communication between the processor LSI 100 and the interface LSI 300 are performed by a through silicon via for signal 11 passing through all the LSIs; this is not limiting provided that the interface LSI and the processor LSI are connectable.

Figure 8:
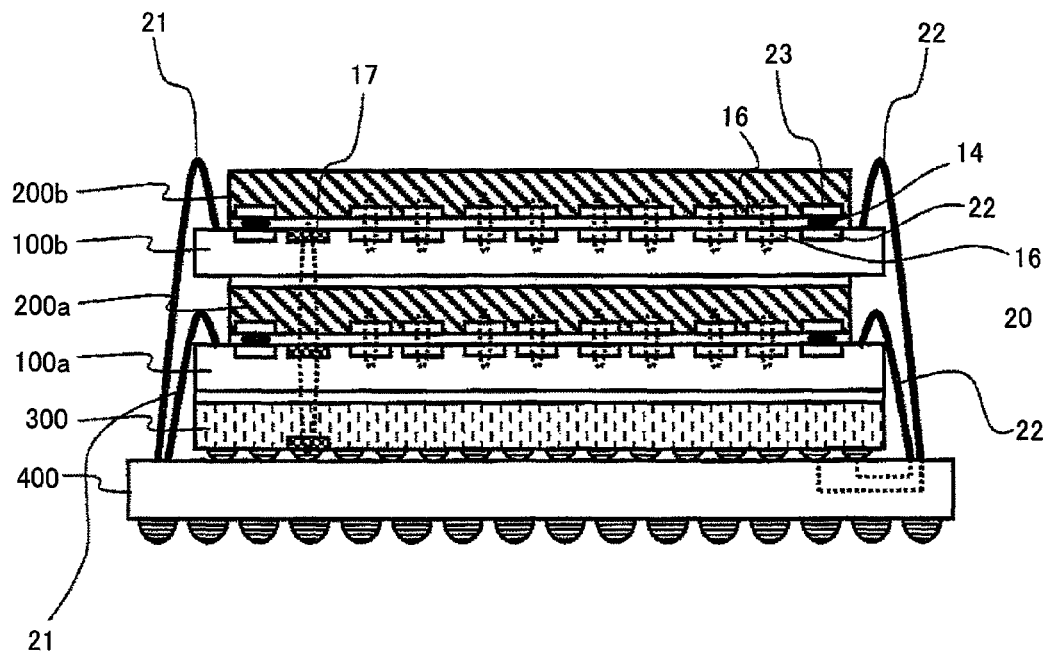
FIG. 8 is a stack sectional view to show a stacked LSI system for performing communication between LSIs by a wireless scheme, as a variant of the first embodiment.

FIG. 8 shows a configuration in which the communication performed via the pads 12, 13 and the solder bump 14, and the communication performed by the through silicon via for signal 11 are respectively performed by wireless communication.

In the embodiment in FIG. 8, a capacitive coupling scheme is utilized as the wireless communication scheme between the processor LSI 100 and memory LSI 200 which are combined together. In this embodiment, metal pads 16 are disposed on the transmission side and the reception side so as to overlap in the vertical direction. Stacking metal pads 16 with an insulator interposed therebetween and in the proximity of a predetermined distance will result in a capacitive coupling so that the electric potential of the receiving-side metal pad 16 varies in response to the variation of the potential difference of the transmission-side metal pad 16. This variation of the potential difference is detected to perform communication.

On the other hand, a inductive coupling scheme is used as the wireless communication scheme between the processor LSIs 100 or between the processor LSI 100 and the interface LSI 300. In this communication scheme, metal inductors 17 are disposed on the transmission side and the reception side overlapping in the vertical direction so that current is applied to the metal inductor 17 to generate an inductive magnetic field on the transmission side, and the changes of this magnetic field are detected on the reception side to perform communication.

Describing the changes in the present embodiment in comparison between FIG. 8 and FIG. 1, alterations are made only in that the electrical communication schemes performed via the solder bump 14 and the through silicon via for signal 11 are replaced respectively with a capacitive coupling scheme and a magnetic inductive coupling scheme, and the logical scheme in the communication and the configuration of the communication section are unchanged as described above.

Further, in FIG. 8, the memory LSI 200 is characterized in that it utilizes a chip smaller than those of the processor LSI 100 and the interface LSI 300. On account of this, bonding metal wire to an exposed portion of the processor LSI 100 becomes possible. Bonding wire for power supply 21 provides power supply to the processor LSI 100. On the other hand, the memory LSI 200 is provided with power supply from the processor LSI 100 combined therewith via the power-supply pad 23 and the solder bump 14. Further, the bonding wire for signal 22 connects between the interface LSI 300 and the processor LSI 100 via a package board 400, and is used for providing initial value signals such as operational frequencies and terminal settings to the processor LSI 100*a* and the processor LSI 100*b*, and for performing the communication between the external LSI 300 and the processor LSI 100.

The reason why a capacitive coupling scheme is used for the communication between the processor LSI 100 and the memory LSI 200 is that since the capacitive coupling scheme can be limited to between metal pads proximate to each other, the capacitive coupling for the communication between the processor LSI 100*a* and the memory LSI 200*a* and the capacitive coupling for the communication between the processor LSI 100*b* and the memory LSI 200*b* do not affect each other even if they are in an overlapped position in the vertical direction. On the other hand, the reason why a magnetic inductive coupling is used between the processor LSIs 100 or between the processor LSI 100 and the interface LSI 300 is that a magnetic field is likely to pass through an LSI substrate and therefore is suitable for the communication over multiple numbers of substrates.

In this configuration, the communication using the metal pad 16 and metal inductor 17 is generally disadvantageous in that it requires a larger circuit layout area compared with the communication using the solder bump 14 and through silicon via for signal 11; but is advantageous in the viewpoint of improving the yield of package production since the fabrication process of connecting the through silicon via for signal 11 between stacked LSIs becomes unnecessary.

On the other hand, for providing power supply, the fabrication process to connect between the processor LSI 100 and the memory LSI 200 with solder bump 14 is necessary. By disposing power supply pads 23 and solder bump 14 with redundancy, it is made possible to provide a stable power supply even when some of solder bumps give rise to connection failure. That is, removing the solder bump 14, which performs the communication of data, will reduce the rate of occurrence of the connection failure due to the solder bump 14, thereby improving the yield of package production.

(Connection of Memory LSI with Global Communication Path)

Although description has been made in FIG. 3 that there is no electrical connection between the through silicon via for signal 11 in the TSV block for 3D intra-chip communication 204 in the memory LSI 200 and the circuit block of the memory LSI 200, the present invention will not be limited to such configuration.

Figure 9:
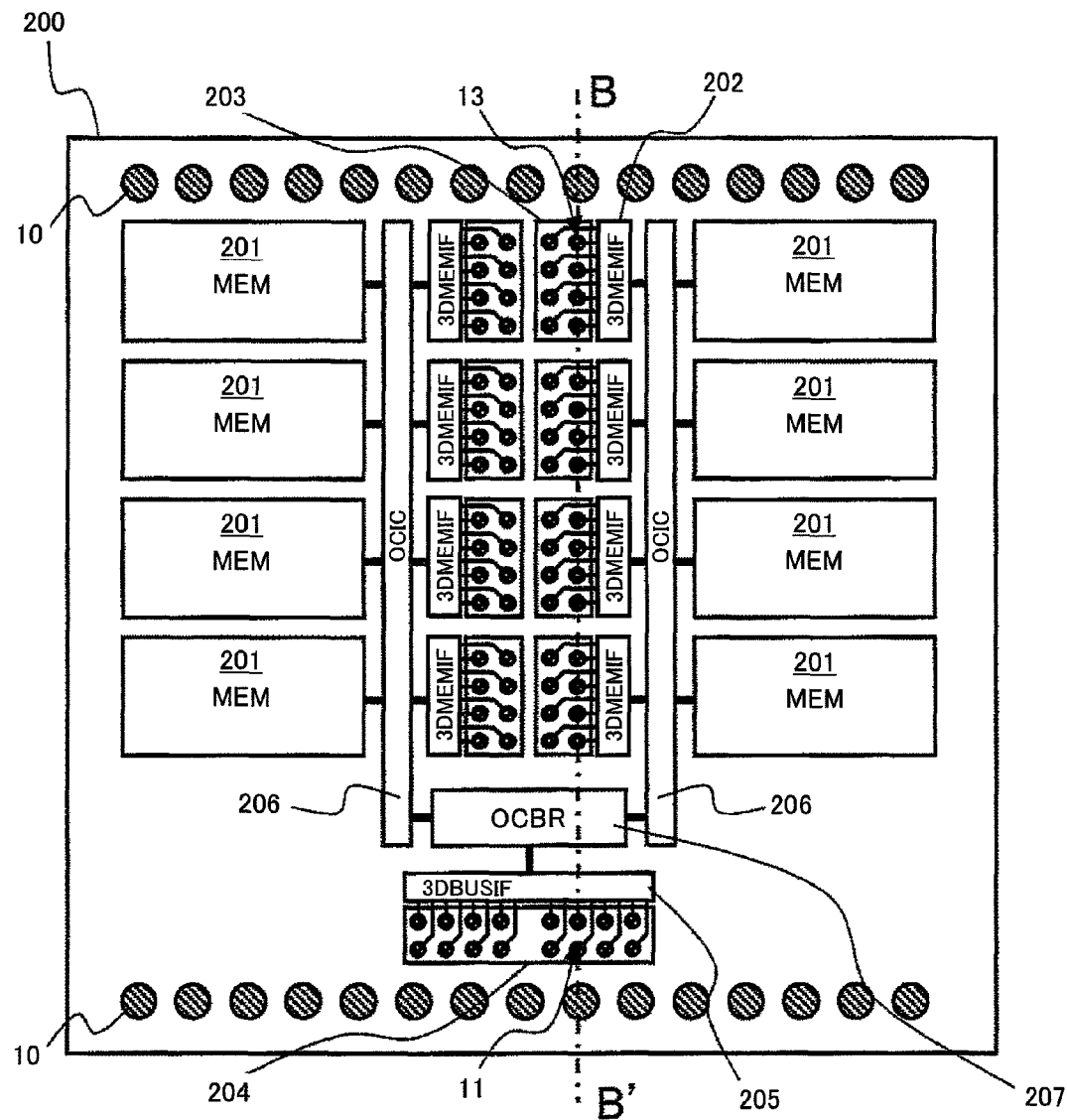
FIG. 9 is a plan view to show an embodiment of the memory LSI 200 as a variant of the first embodiment.

For example, FIG. 9 is a plan block diagram to show another embodiment of the memory LSI 200, in contrast with FIG. 3. In FIG. 9, like parts corresponding to those of FIG. 3 are given like reference characters and detailed description thereof will not be repeated.

Referring to the memory LSI 200 of FIG. 9, what differs from the memory LSI 200 shown in FIG. 3 is that a 3D intra-chip communication interface 205 to be connected to the TSV block for 3D intra-chip communication 204 is provided; an on-chip interconnect 206 is provided between the 3D stacked memory interface 202 and the memory block 201; and an on-chip interconnect bridge 207 for bridging between the 3D intra-chip communication interface 205 and the on-chip interconnect 206.

In this configuration, although the memory LSI 200 has less storage capacity since the area assigned to the memory block 201 is reduced, it becomes possible to receive direct information from the TSV block for 3D intra-chip communication 204, and therefore the delay time when performing the communication with the processor LSI 100 of another combination or with the interface LSI 300 will be reduced.

EXAMPLE 2

Figure 10:
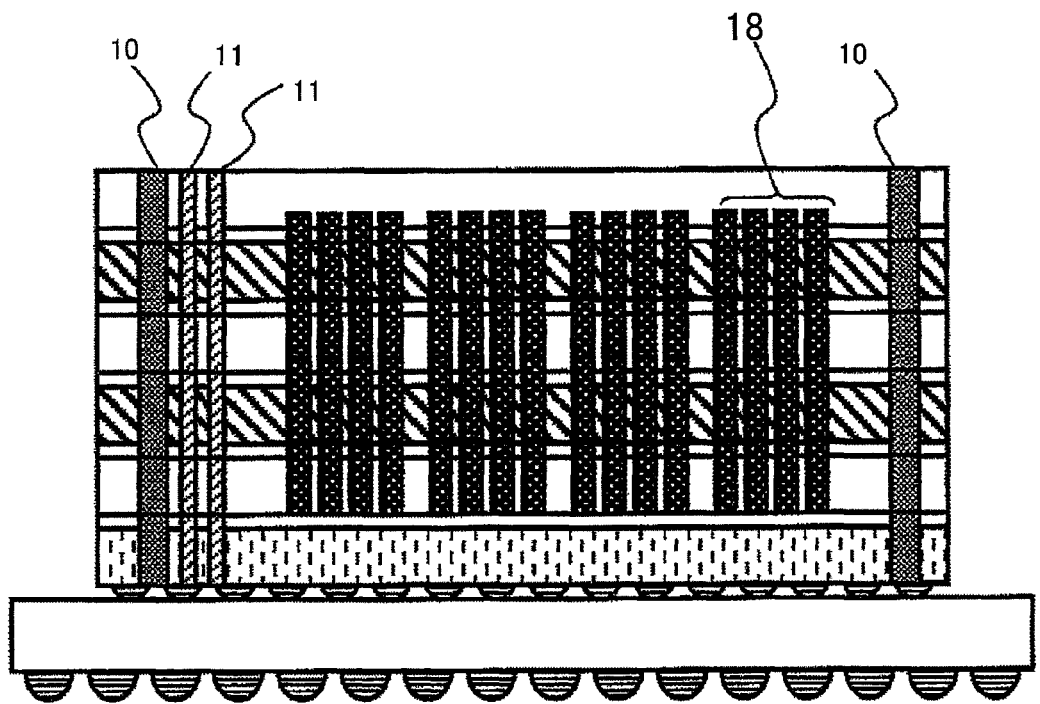
FIG. 10 is a stack sectional view to show a stacked LSI system relating to a second embodiment.

FIG. 10 is a stack sectional view of the semiconductor device relating a second embodiment of the present invention, in contrast with FIG. 1. In FIG. 10, like parts corresponding to those of FIG. 1 are given like reference characters and detailed description thereof will not be repeated. In FIG. 10, a stacked LSI system is configured such that a processor LSI 100a, a processor LSI 100b, and a processor LSI 100c are stacked respectively interposing a memory LSI 200a and a memory LSI 200b therebetween, and an interface LSI 300 and a package board 400 are stacked in the underlying layer of those stacked five LSIs. Moreover, in FIG. 10, the processor LSIs 100a, 100b and 100c are electrically connected with the memory LSIs 200a and 200b through a TSV block for memory access 18.

Figure 11:
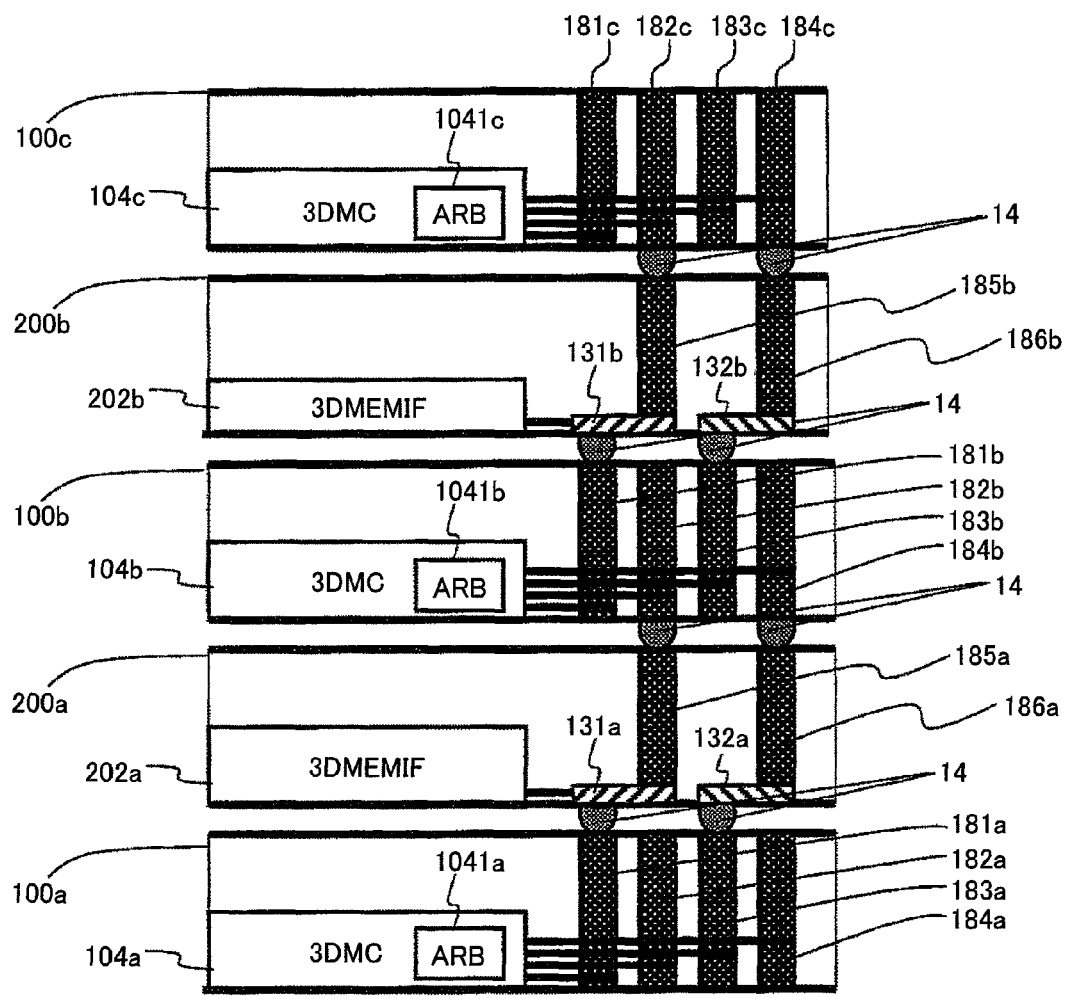
FIG. 11 shows the connection configuration of the processor LSIs 100*a* to 100*c* and the memory LSIs 200*a* and 200*b* in FIG. 8.

FIG. 11 shows the connection configuration between the processor LSIs 100a, 100b and 100c and the memory LSIs 200a and 200b in more detail. Through silicon vias 181a to 181c, 182a to 182c, 183a to 183c, and 184a to 184c are through silicon vias provided in the processor LSIs 100a to 100c, and are electrically connected respectively to 3D stacked memory access controllers 104a to 104c on the processor LSIs 100a to 100c. It is noted that although wirings to be connected are schematically shown by solid lines in FIG. 11, they are to be implemented by metal wirings and the like provided on the circuit layout surface. The through silicon vias 185a to 185b, and 186a and 186b are through silicon vias provided in the memory LSIs 200a and 200b; and the through silicon vias 185a and 185b are electrically connected with pads 131a and 131b in the memory LSIs 200a and 200b, and the through silicon vias 186a and 186b in the memory LSIs 200a and 200b are electrically connected with pads 132a and 132b. Further, pads 131a and 131b are connected with 3D stacked memory interfaces 202a and 202b in the memory LSIs 200a and 200b through metal wirings provided on the circuit layout surface.

The through silicon vias 181a to 181c, 182a to 182c, 183a to 183c, 184a to 184c, 185a and 185b, and 186a and 186b are electrically connected in the form shown in FIG. 11 via the solder bump 14, the pads 131a and 131b, and the pads 132a and 132b. For example, the through silicon via 181a, the through silicon via 185a, and the through silicon via 182b are electrically connected respectively via the pad 131a and the solder bump 14 so that the wiring enables the communication between the 3D stacked memory access controller 104a in the processor LSI 100a or the 3D stacked memory access controller 104b in the processor LSI 100b and the 3D stacked memory interface 202a in the memory LSI 200a.

Further, the through silicon via 183a, the through silicon via 186a, and the through silicon via 184b are electrically connected respectively via the pads 132a and the solder bump 14, so that the wiring enables the communication between the 3D stacked memory access controller 104a in the processor LSI 100a and the 3D stacked memory access controller 104b in the processor LSI 100b.

That is, the present embodiment is characterized by including two kinds of wiring: a wiring through which the processor LSI 100a and the processor LSI 100b, which are stacked interposing a memory LSI 200 therebetween, can directly communicate with each other, and a wiring through which the processor LSI 100a, processor LSI 100b, and the memory LSI 200a can communicate directly with one other. Further, the present embodiment is also characterized in that the pads 131a and 131b and the pads 132a and 132b serve to displace the wiring between the through silicon vias in the horizontal direction, as a result of which, the above described connection configuration can be achieved by using the processor LSIs 100a and 100b of the same layout configuration.

Next, the communication in the present embodiment will be described. In FIG. 11, the 3D stacked memory access controller 104a in the processor LSI 100a includes a memory access arbiter 1041a. The memory access arbiter 1041a arbitrates a memory access request of the processor LSI 100a to the memory LSI 200a, and the access from the processor LSI 100b to the memory LSI 200a. First, when accessing the memory LSI 200a, the processor LSI 100a notifies an access request to the memory access arbiter 1041a, and when the access right is obtained, communicates access information to the 3D stacked memory interface 202a in the memory LSI 200a by the through silicon via 181a and the through silicon via 185a. On the other hand, when the processor LSI 100b accesses the memory LSI 200a, it notifies an access request to the memory access arbiter 1041a in the processor LSI 100a by the through silicon via 184b, the through silicon via 186a, and through silicon via 183a, and when the access right is obtained, communicates access information to a 3D stacked memory interface 202a in the memory LSI 200a by the through silicon via 182b and the through silicon via 185a.

Thus, in the present embodiment, both the processor LSI 100a and the processor LSI 100b are configured so as to be able to access the memory LSI 200a interposed therebetween. Similarly, both the processor LSI 100b and the processor LSI 100c are able to access the memory LSI 200b. Therefore, in the present embodiment, the processor LSIs which are closest in the stacking direction can perform the passing of the processing result and data via the memory LSI 200 interposed therebetween.

In the above described correspondence of the global communication path and the inter-combination-LSI communication path, the configuration of the communication section is similar to that in FIGS. 2 to 4, it is characteristic that each processor LSI and memory LSI can communicate with adjacent LSIs which are not combined therewith. This characteristic makes it possible to perform the passing of the processing result and data in both up and down directions.

What is claimed is:

1. A semiconductor device, comprising:
   a package board;
   a first LSI connected to the package board including: an external I/O interface for performing communication via the package board; and a first communication section;
   a second LSI provided above the first LSI including: a first memory device having a plurality of first memory cells; and a second communication section;
   a third LSI provided above the first LSI for performing arithmetic operation including: a third communication section for communicating with the second communication section; and a fourth communication section for communicating with the first communication section;
   a fourth LSI provided above the second LSI and above the third LSI including: a second memory device including a plurality of second memory cells; and a fifth communication section; and
   a fifth LSI provided above the second LSI and above the third LSI for performing arithmetic operation including: a sixth communication section for communicating with the fifth communication section; and a seventh communication section for communicating with the first communication section.

2. The semiconductor device according to claim 1; wherein communication is performed between the fourth LSI and the fifth LSI by using the fifth communication section and the sixth communication section during a first period in which communication is performed between the second LSI and the third LSI by using the second communication section and the third communication section.

3. The semiconductor device according to claim 1; further comprising:
   a first solder bump for connecting the second communication section with the third communication section; and
   a second solder bump for connecting the fifth communication section with the sixth communication section.

4. The semiconductor device according to claim 1; wherein
   the second LSI is configured such that a surface on which circuitry is constructed faces toward the third LSI;
   the third LSI is configured such that a surface on which circuitry is constructed faces toward the second LSI;
   the fourth LSI is configured such that a surface on which circuitry is constructed faces toward the fifth LSI; and
   the fifth LSI is configured such that a surface on which circuitry is constructed faces toward the fourth LSI.

5. The semiconductor device according to claim 1; further comprising:
   a first through silicon via provided so as to pass through the second LSI and the third LSI and for electrically connecting the first communication section, the fourth communication section, and the seventh communication section.

6. The semiconductor device according to claim 1; wherein communication between any two of the first communication section, fourth communication section, and seventh communication section is performed by wireless communication.

7. The semiconductor device according to claim 1; wherein communication between the second communication section and the third communication section is performed by wireless communication; and
   communication between the fourth communication section and the fifth communication section is performed by wireless communication.

8. The semiconductor device according to claim 1; further comprising:
   a first bonding wire for connecting the package board with the third LSI; and
   a second bonding wire for connecting the package board with the fifth LSI, wherein
   a first power supply is provided to the third LSI via the first bonding wire, and
   a second power supply is provided to the fifth LSI via the second bonding wire.

9. The semiconductor device according to claim 1; wherein the sixth communication section further performs communication with the third communication section.

10. The semiconductor device according to claim 1; wherein
    the fourth communication section includes a sixth memory device for storing a third identifier indicating the third LSI;
    the seventh communication section includes a seventh memory device for storing a fourth identifier indicating the fifth LSI;
    when the third LSI requests data transfer of third data to the fifth LSI, a third request signal which is a request signal corresponding to the third data includes the third identifier; and
    when the fifth LSI requests data transfer of fourth data to the third LSI, a fourth request signal which is a request signal corresponding to the fourth data includes the fourth identifier.

11. The semiconductor device according to claim 1; wherein
    the second communication section does not communicate with any communication section excepting the third communication section;
    the third communication section does not communicate with any communication section excepting the second communication section;
    the fifth communication section does not communicate with any communication section excepting the sixth communication section; and
    the sixth communication section does not communicate with any communication section excepting the fifth communication section.

12. The semiconductor device according to claim 1; wherein
    the first communication section comprises an arbitration function when communicating with the fourth communication section and the seventh communication section.

13. The semiconductor device according to claim 1; further comprising:
    a first bonding wire for connecting the package board with the third LSI; and
    a second bonding wire for connecting the package board with the fifth LSI, wherein
    communication between the first communication section and the fourth communication section is performed via the first bonding wire, and
    communication between the first communication section and the seventh communication section is performed via the second bonding wire.

14. The semiconductor device according to claim 13; wherein
    transmission/reception of first data is performed between the first communication section and the fourth communication section via the first bonding wire;

transmission/reception of second data is performed between the first communication section and the seventh communication section via the second bonding wire;

the first data is data to represent identification information of the third LSI or an initial value of operation frequency of the third LSI; and the second data is data to represent identification information of the fifth LSI or an initial value of operation frequency of the fifth LSI.

15. The semiconductor device according to claim 1; further comprising
  a sixth LSI including: a third memory device provided above the first LSI and including a plurality of third memory cells; and an eighth communication section for communicating with the third communication section.

16. The semiconductor device according to claim 15; wherein
  the second communication section includes a fourth memory device for storing a first identifier indicating the second LSI;
  the eighth communication section includes a fifth memory device for storing a second identifier indicating the sixth LSI;
  when the third LSI requests data transfer of first data to the second LSI, a first request signal which is a request signal corresponding to the first data includes the first identifier; and
  when the third LSI requests data transfer of second data to the sixth LSI, a second request signal which is a request signal corresponding to the second data includes the second identifier.

17. The semiconductor device according to claim 1; further comprising:
  a second through silicon via provided so as to pass through the first LSI, second LSI, third LSI, fourth LSI, and fifth LSI, and for providing a first power supply to the first LSI, second LSI, third LSI, fourth LSI, and fifth LSI.

18. The semiconductor device according to claim 17; further comprising:
  a third through silicon via provided so as to pass through the second LSI and the third LSI and for providing a second power supply to the second LSI and the fourth LSI.

19. The semiconductor device according to claim 17; further comprising:
  a fourth through silicon via provided so as to pass through the second LSI, third LSI and fourth LSI and for providing a third power supply to the third LSI and the fifth LSI.

20. The semiconductor device according to claim 17; further comprising:
  a fifth through silicon via to be connected with the second communication section and the third communication section, and a sixth through silicon via to be connected with the fifth communication section and the sixth communication section, wherein
  the fifth through silicon via provides a second power supply to the second LSI and the third LSI; and
  the sixth through silicon via provides a third power supply to the fourth LSI and the fifth LSI.

* * * * *